(12) United States Patent
Choi

(10) Patent No.: US 7,816,684 B2
(45) Date of Patent: Oct. 19, 2010

(54) LIGHT EMITTING DISPLAY DEVICE AND METHOD OF FABRICATING THE SAME

(75) Inventor: Byoung-Deog Choi, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 179 days.

(21) Appl. No.: 12/213,736

(22) Filed: Jun. 24, 2008

(65) Prior Publication Data

US 2009/0072247 A1   Mar. 19, 2009

(30) Foreign Application Priority Data

Sep. 14, 2007   (KR) .................... 10-2007-0093633

(51) Int. Cl.
  *H01L 21/00* (2006.01)
(52) U.S. Cl. .............. 257/59; 257/66; 257/72; 257/80; 257/84; 257/103; 257/E27.111; 257/E27.133; 257/E29.275; 257/E29.295; 257/E33.013; 257/E33.055; 257/E33.076
(58) Field of Classification Search ............ 257/59–66, 257/72–84, 103, E27.111, 133, 29.275, 295, 257/33.013, 55, 51.018
See application file for complete search history.

(56) References Cited

U.S. PATENT DOCUMENTS

| | | | |
|---|---|---|---|
| 5,225,706 A | 7/1993 | Berger et al. | |
| 6,890,875 B2 | 5/2005 | Li et al. | |
| 7,068,246 B2 | 6/2006 | Yamazaki et al. | |
| 7,166,966 B2 | 1/2007 | Naugler, Jr. et al. | |
| 7,199,412 B2 | 4/2007 | Sawase et al. | |
| 7,326,313 B2 * | 2/2008 | Lee et al. ............... | 156/236 |
| 7,345,314 B2 * | 3/2008 | Chung et al. ............ | 257/84 |
| 7,456,431 B2 * | 11/2008 | Um et al. ............... | 257/72 |
| 7,612,377 B2 * | 11/2009 | Moon et al. ............. | 257/72 |
| 7,629,610 B2 * | 12/2009 | Yamazaki et al. ........ | 257/59 |
| 2005/0035932 A1 | 2/2005 | Nishikawa et al. | |
| 2005/0200291 A1 | 9/2005 | Naugler, Jr. et al. | |
| 2005/0200292 A1 | 9/2005 | Naugler, Jr. et al. | |
| 2005/0200294 A1 | 9/2005 | Naugler, Jr. et al. | |
| 2005/0200296 A1 | 9/2005 | Naugler, Jr. et al. | |
| 2005/0285822 A1 | 12/2005 | Reddy et al. | |
| 2006/0007204 A1 | 1/2006 | Reddy et al. | |
| 2006/0012311 A1 | 1/2006 | Ogawa | |
| 2006/0128054 A1 * | 6/2006 | Kim et al. ............... | 438/82 |
| 2007/0138951 A1 * | 6/2007 | Park et al. .............. | 313/504 |
| 2007/0273291 A1 | 11/2007 | Choi et al. | |
| 2009/0011528 A1 * | 1/2009 | Lee et al. ............... | 438/29 |
| 2009/0072248 A1 * | 3/2009 | Im et al. ................ | 257/80 |

FOREIGN PATENT DOCUMENTS

| | | |
|---|---|---|
| JP | 02-138772 A | 5/1990 |
| JP | 2002-280596 A | 9/2002 |
| JP | 2002-368254 | 12/2002 |

(Continued)

*Primary Examiner*—Michael S Lebentritt
(74) *Attorney, Agent, or Firm*—Lee & Morse, P.C.

(57) ABSTRACT

A light emitting display device includes a light emitting diode and a thin film transistor on a substrate, the light emitting diode and thin film transistor being electrically coupled to each other, and a photo diode on the substrate, the photo diode including an intrinsic region and a P-type doping region coupled to each other.

9 Claims, 3 Drawing Sheets

FOREIGN PATENT DOCUMENTS

| | | |
|---|---|---|
| JP | 2005-019353 A | 1/2005 |
| JP | 2005-116681 | 4/2005 |
| JP | 2006-308959 A | 11/2006 |
| JP | 2007-173832 A | 7/2007 |
| KR | 10-1999-0012529 A | 2/1999 |
| KR | 10-2001-0112630 A | 12/2001 |
| KR | 10-2004-0029943 A | 4/2004 |
| KR | 10-2005-0009211 A | 1/2005 |
| KR | 10-2005-0121090 A | 12/2005 |
| KR | 10-2006-0050070 A | 5/2006 |
| KR | 10-0759681 B1 | 9/2007 |
| KR | 10-0759689 B1 | 9/2007 |
| WO | WO 2005/081810 A2 | 9/2005 |

* cited by examiner

LIGHT EMITTING DISPLAY DEVICE AND METHOD OF FABRICATING THE SAME

BACKGROUND OF THE INVENTION

1. Field of the Invention

Embodiments of the present invention relate to a light emitting display device and a method of fabricating the same. More particularly, embodiments of the present invention relate to a light emitting display device with a photo diode and to a method of fabricating the same.

2. Description of the Related Art

A light emitting display device may include a light emitting diode (LED) that emits visible light to display images. The LED, however, may have high power consumption due to a constant luminance value thereof regardless of changes in ambient light. Therefore, attempts have been made to use a photo diode (PD) to control luminance of the LED. The PD may convert light energy, e.g., light emitted from the LED or ambient light, into an electrical signal, e.g., electric current or voltage, by generating electrons or holes in accordance with an optical absorption, e.g., intensity of light.

The conventional PD in the light emitting display device, however, may include an intrinsic region between a region doped with P-type impurities and a region doped with N-type impurities, i.e., a PIN structure. Use of both P-type and N-type impurities in the PD may require use of multiple masks to form the PD. Further, additional masks may be required to form both the PD and a thin film transistor (TFT) of the light emitting display device with both P-type and N-type impurities. Accordingly, manufacturing costs and processes of the light emitting display device may be increased.

SUMMARY OF THE INVENTION

Embodiments of the present invention are therefore directed to a light emitting display device and a method of fabricating the same, which substantially overcome one or more of the disadvantages and shortcomings of the related art.

It is therefore a feature of an embodiment of the present invention to provide a light emitting display device with a PD having a simplified structure.

It is therefore another feature of an embodiment of the present invention to provide a light emitting display device with a PD having increased light sensitivity.

It is yet another feature of an embodiment of the present invention to provide a method of fabricating a light emitting display device with a PD having one or more of the above features.

At least one of the above and other features and advantages of the present invention may be realized by providing a light emitting display device, including a light emitting diode and a thin film transistor on a substrate, the light emitting diode and thin film transistor being electrically coupled to each other; and a photo diode on the substrate, the photo diode including an intrinsic region and a P-type doping region coupled to each other. The light emitting display device may further include a first metal electrode coupled to the intrinsic region of the photo diode and a second metal electrode coupled to the P-type doping region of the photo diode, the first and second metal electrodes having a space therebetween.

An upper surface of the intrinsic region of the photo diode may overlap the space between the first and second metal electrodes. The thin film transistor may be a PMOS. The photo diode may be spaced apart from the thin film transistor. The photo diode and the thin film transistor may be co-planar along a plane parallel to a plane of the substrate. The P-type doping region and the intrinsic region of the photo diode may be co-planar along a plane parallel to a plane of the substrate. The P-type doping region may be between the thin film transistor and the intrinsic region. The light emitting display device may further include a controller, the controller being configured to control voltage applied to the light emitting diode in accordance with an electrical signal output from the photo diode. The photo diode may consist essentially of the P-type doping region and the intrinsic region.

At least one of the above and other features and advantages of the present invention may be also realized by providing a method of fabricating a light emitting display device, including forming a thin film transistor on a substrate, forming a photo diode on the substrate, the photo diode including an intrinsic region and a P-type doping region coupled to each other, and forming a light emitting diode on the substrate, such that the light emitting diode and the thin film transistor are electrically coupled to each other.

Forming the photo diode and the thin film transistor on the substrate may include disposing a first polycrystalline silicon layer and a second polycrystalline silicon layer, respectively, on the substrate. The first and second polycrystalline silicon layers may be co-planar. Forming the photo diode and the thin film transistor on the substrate may further include doping one side of the first polycrystalline silicon layer and both sides of the second polycrystalline silicon layer with P-type impurities to form a P-type doping region in one side of the first polycrystalline silicon layer and a source region and a drain region in the second polycrystalline silicon layer. Doping the first and second polycrystalline silicon layers may include using a single mask. Doping of the first and second polycrystalline silicon layers may be simultaneous. The method may further include stacking a first dielectric layer and a second dielectric layer on the substrate to cover the first polycrystalline silicon layer and the second polycrystalline silicon layer. The method may further include forming contact holes through the first and second dielectric layers, such that first and second electrodes are coupled to the photo diode through the contact holes and source and drain electrodes are coupled to the thin film transistor through the contact holes.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
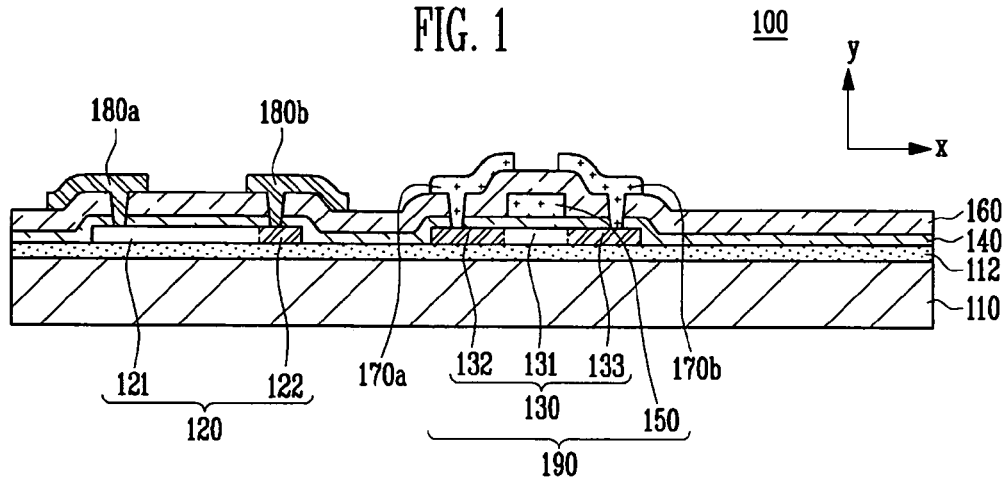
FIG. 1 illustrates a partial cross-sectional view of a light emitting display device according to an exemplary embodiment of the present invention.

Korean Patent Application No. 10-2007-0093633, filed on Sep. 14, 2007, in the Korean Intellectual Property Office, and entitled: "Light Emitting Display Device and Method of Fabrication the Same," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers, elements, and regions may be exaggerated for clarity of illustration. It will also be understood that when a layer or element is referred to as being "on" another layer, element, or substrate, it can be directly on the other layer, element, or substrate, or intervening layers and/or elements may also be present. Further, it will be understood that the term "on" can indicate solely a vertical arrangement of one element with respect to another element, and may not indicate a vertical orientation, e.g., a horizontal orientation. In addition, it will be understood that when a layer or element is referred to as being "under" another layer or element, it can be directly under, or one or more intervening layers and/or elements may also be present. Further, it will also be understood that when a layer or element is referred to as being "between" two layers or elements, it can be the only layer or element between the two layers or elements, or one or more intervening layers and/or elements may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

FIG. 1 illustrates a cross-sectional view of a light emitting display device according to one exemplary embodiment of the present invention. Referring to FIG. 1, a light emitting display device 100 may include a TFT 190 and a PD 120 on a substrate 110. The light emitting display device 100 may further include a LED (not shown), e.g., an organic light emitting diode (OLED), on the substrate 110.

The TFT 190 may include a semiconductor layer 130, a gate electrode 150, and source/drain electrodes 170a and 170b. The semiconductor layer 130 of the TFT 190 may include a source region 132, a drain region 133, and an intrinsic region 131 between the source region 132 and the drain region 133. Both the source region 132 and the drain region 133 of the semiconductor layer 130 may be doped with impurity having a substantially same conductivity. For example, both the source and drain regions 132 and 133 may be doped with P-type impurities to form a P-type TFT, i.e., a PMOS. Forming the source and drain regions 132 and 133 to have a substantially same conductivity may reduce the required number of masks during processing. For example, if the TFT 190 is a PMOS, no separate masks are used to implant N-type impurities in the semiconductor layer 130, so formation of a PMOS may require a lower number of masks than, e.g., a CMOS. Accordingly, productivity and yield of the light emitting display device 100 may be improved.

A buffer layer 112 may be disposed between the substrate 110 and the TFT 190, so the semiconductor layer 130 of the TFT 190 may be formed on the buffer layer 112. A first dielectric layer 140 may be formed on the buffer layer 112 to cover the semiconductor layer 130, i.e., the semiconductor layer 130 may be between the buffer layer 112 and the first dielectric layer 140. The gate electrode 150 may be formed on the first dielectric layer 140 in a region corresponding to the intrinsic region 131 of the semiconductor layer 130. A second dielectric layer 160 may be formed on the first dielectric layer 140 to cover the gate electrode 150, i.e., the gate electrode 150 may be between the first and second dielectric layers 140 and 160. The source and drain electrodes 170a and 170b may be disposed on the second dielectric layer 160, so the source electrode 170a and the drain electrode 170b may be coupled respectively to the source region 132 and the drain region 133 of the semiconductor layer 130 through contact holes in the first and second dielectric layers 140 and 160.

The light emitting display device 100 may further include a third dielectric layer (not shown) on the TFT 190, so the LED may be formed on the third dielectric layer. The LED may be electrically coupled to the TFT 190. The LED may be any suitable LED, e.g., an OLED. A controller may be connected to the LED for controlling luminance thereof in accordance with electrical signals, e.g., voltage signals, output by the PD 120.

The PD 120 of the light emitting display device 100 may be electrically coupled to the LED, and may control luminance of the LED. For example, the PD 120 may be between the substrate 110 and the LED in a non-light emission region of the light emitting display device 100. In particular, the PD 120 may be on the buffer layer 112, and may be spaced apart from the TFT 190 along the x-axis. More specifically, the semiconductor layer 130 of the TFT 190 and the PD 120 may be co-planar along a plane parallel to the substrate 110, e.g., a horizontal plane along the x-axis. For example, both the semiconductor layer 130 and the PD 120 may be directly on the buffer layer 112. Further, the semiconductor layer 130 and the PD 120 may be formed of a substantially same material, e.g., polycrystalline silicon. As such, formation of the PD 120 and the semiconductor layer 130 may be substantially simplified by depositing two polycrystalline silicon layers spaced apart from each on a same plane, e.g., simultaneously.

The PD 120 may include a single impurity region having a substantially same conductivity as the source and drain regions 132 and 133 of the semiconductor layer 133. For example, the PD 120 may include a P-type impurity region. More specifically, the PD 120 may include a P-type doping region 122, an intrinsic region 121, and first and second electrodes 180a and 180b for applying a voltage to the intrinsic region 121 and the P-type doping region 122, respectively. The first and second electrodes 180a and 180b may be metal electrodes. Therefore, the PD 120 may have a metal intrinsic P+ (MIP) structure. In the MIP structure, M represents the first and second electrodes 180a and 180b, I represents the intrinsic region 121, and P represents the P-type doping region 122.

The P-type doping region 122 and the intrinsic region 121 may be coplanar along a plane parallel to the substrate 110, and may be coupled to each other. More specifically, one side of the polycrystalline silicon layer of the PD 120 may be doped with P-type impurities simultaneously with the polycrystalline silicon layer of semiconductor layer 130 to form the P-type doping region 122. A side of the polycrystalline silicon layer of the PD 120 not doped with P-type impurities may define the intrinsic region 121.

The P-type doping region 122 of the PD 120 may be formed on the buffer layer 112, and may be on a side of the PD 120 adjacent to the semiconductor layer 130 of the TFT 190. More specifically, the P-type doping region 122 may be between the intrinsic region 121 and the TFT 190. Therefore, the P-type doping region 122 of the PD 120 may not require a separate mask for implanting P-type impurity therein, i.e., may be formed via a same mask used to form the doping regions of the semiconductor layer 130. The intrinsic region 121 may be on the buffer layer 112 and in direct contact with the P-type doping region 122. Therefore, a thickness of the light emitting display device 100 may be minimized due to a horizontal structure of the PD 120, i.e., the P-type doping region 122 and the intrinsic region 121 being on a substantially same plane. The first and second dielectric layers 140 and 160 may be on the PD 120, so the first and second electrodes 180a and 180b may be electrically coupled to the intrinsic region 121 and the P-type doping region 122, respectively, via contact holes in the first and second dielectric layers 140 and 160.

The PD 120 may be a semiconductor device for converting an optical signal into an electrical signal, and its driving method is as follows. When a negative (−) voltage is applied to the P-type doping region 122 through the second electrode 180b and a positive (+) voltage is applied to the intrinsic region 121 through the first electrode 180a simultaneously, the PD 120 may generate electrons and holes in the intrinsic region 121 in accordance with light incident on the intrinsic region 121. Current may flow in the intrinsic region 123 by means of a reverse electric field.

The PD 120 according to embodiments of the present invention may include only a P-type doping region, i.e., may not include a N-type doping region, so the number of doping stages and masks may be reduced, thereby simplifying a manufacturing process of the PD 120. Also, the PD 120 may be formed to have a MIP structure, so light sensitivity of the PD 120 may be higher as compared, e.g., to a PD having a PIN structure, and therefore, the PD 120 may have an increased efficiency in controlling luminance of the LED. A comparison between the PD 120 and a PD having a PIN structure will be explained in more detail below with reference to FIG. 4. It is noted that a PD having a PIN structure refers to a PD having a P-type doping region, an N-type doping region, and an intrinsic region between the P-type doping region and the N-type doping region.

Accordingly, a light emitting display device formed according to embodiments of the present invention may have reduced power consumption of its LED due to improved luminance control thereof via the PD. In addition, ambient light, i.e., light external to the light emitting display device 100, may be measured with improved accuracy due to improved light sensitivity of the PD 120, thereby providing improved display properties of the light emitting display device 100.

FIGS. 2A-2D illustrate sequential cross-sectional views of a method for fabricating the light emitting display device 100 according to one exemplary embodiment of the present invention.

Figure 2A:
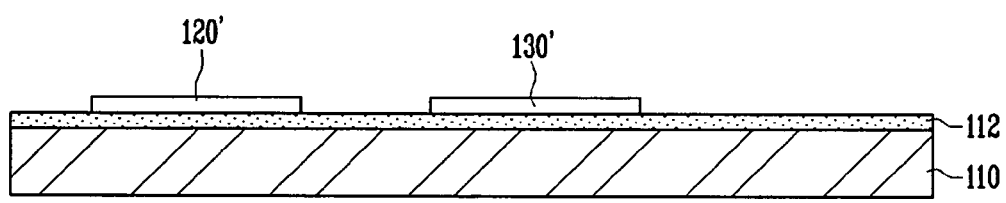
FIGS. 2A-2D illustrate sequential cross-sectional views of a method for fabricating a light emitting display device according to an exemplary embodiment of the present invention.

Referring to FIG. 2A, the buffer layer 112 may be formed on the substrate 110. Patterned first and second polycrystalline silicon layers 120' and 130' may be formed on an upper surface of the buffer layer 112. The first and second polycrystalline silicon layers 120' and 130' may be spaced apart from each other.

Figure 2B:
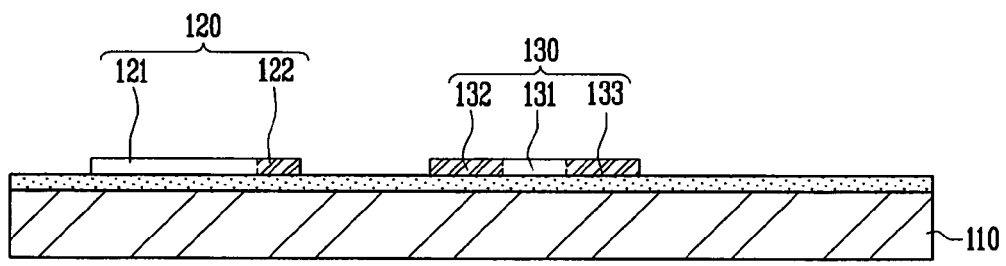

Referring to FIG. 2B, a single mask (not shown) may be used to implant P-type impurities simultaneously into one side of the first polycrystalline silicon portion 120' and into two sides of the second polycrystalline silicon portion 130', as illustrated by the shadowed portions in FIG. 2B. Doping of the one side of the first polycrystalline silicon portion 120' with P-type impurities may form the P-type doping region 122. Doping of the both sides of the second polycrystalline silicon portion 130' with P-type impurities may form the source/drain regions 132 and 133. The undoped portions of the first and second polycrystalline silicon portions 120' and 130' may be formed into the intrinsic region 121 of the PD 120 and the intrinsic region 131 of the semiconductor layer 130, respectively. Therefore, the first polycrystalline silicon portion 120' may be formed into the PD 120, and the second polycrystalline silicon portion 130' may be formed into the semiconductor layer 130 of the TFT 190. The intrinsic region 131 of the semiconductor layer 130 may correspond to a channel region between the source and drain regions 132 and 133.

Figure 2C:
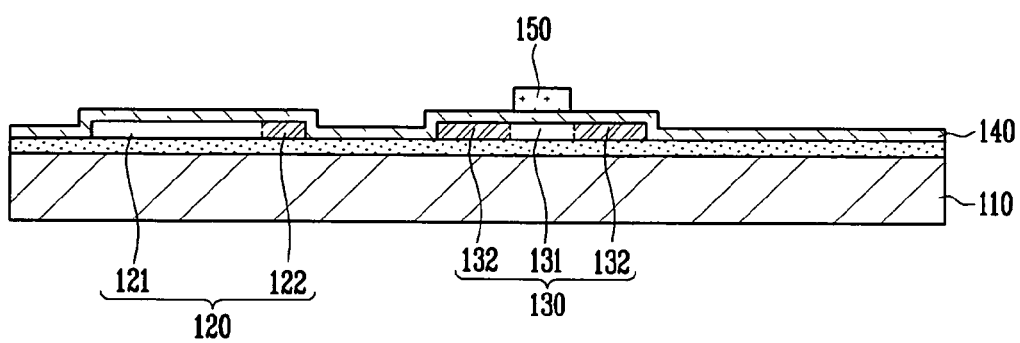

Referring to FIG. 2C, the first dielectric layer 140 may be formed on the buffer layer 112 to cover the semiconductor layer 130 and the PD 120. Also, the gate electrode 150 may be formed on the first dielectric layer 140 in a region corresponding to the intrinsic region 131 of the semiconductor layer 130, i.e., the gate electrode 150 may overlap the intrinsic region 131.

Figure 2D:
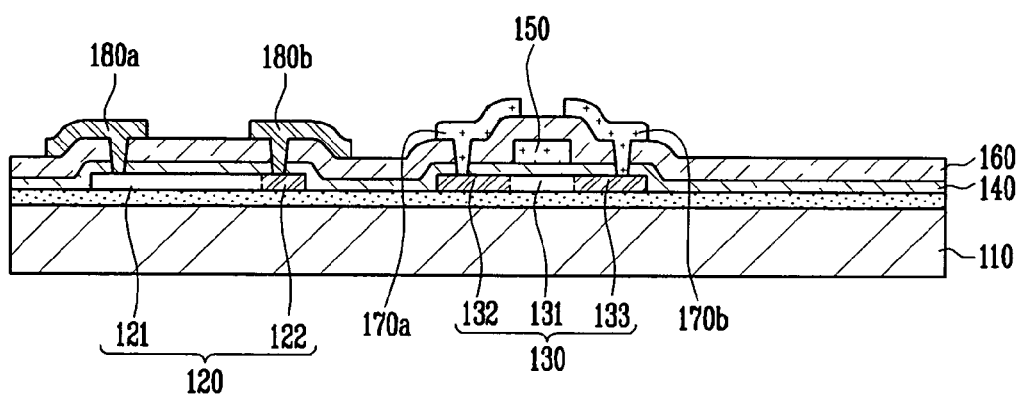

Referring to FIG. 2D, the second dielectric layer 160 may be formed on the first dielectric layer 140 to cover the gate electrode 150. Then, the first and second dielectric layers 140 and 160 may be etched to form contact holes therethrough to expose portions of upper surfaces of the source/drain regions 132 and 133 of the semiconductor layer 130 and portions of upper surfaces of the P-type doping region 122 and the intrinsic region 121 of the PD 120. Source and drain electrodes 170a and 170b may be coupled via the contact holes to the source and drain regions 132 and 133, respectively. First and second electrodes 180a and 180b may be coupled via the contact holes to the intrinsic region 121 and the P-type doping region 122, respectively.

Figure 3:
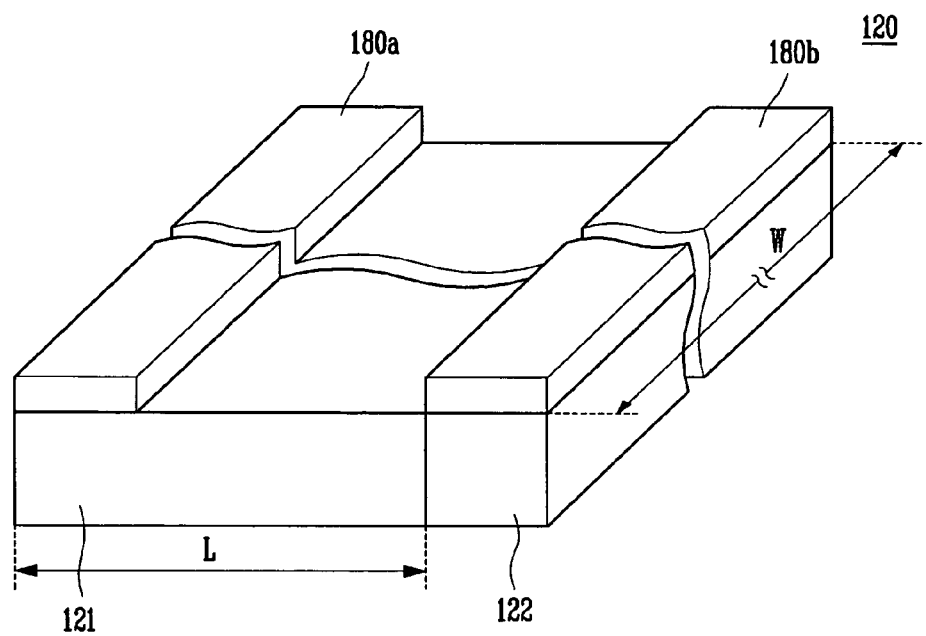
FIG. 3 illustrates a perspective view of a PD according to an exemplary embodiment of the present invention.

The first electrode 180a and the second electrode 180b may be spaced apart from each other along the x-axis to form sufficient space for transmitting light into the intrinsic region 121. More specifically, as illustrated in FIG. 3, a portion of the intrinsic region 121 of the PD 120 may be between the first electrode 180a and the second electrode 180b, and may have a predetermined surface area of an upper surface thereof to provide light transmittance. For example, the intrinsic region 121 may have a predetermined length L, e.g., about 4 μm, and a predetermined width W, e.g., about 25,000 μm, to form an exposed surface area, so light may be incident on the upper surface of the intrinsic region 121 between the first and second electrodes 180a and 180b. The length L and width W of the intrinsic region 121 may be varied according to a size of the PD 120.

Figure 4:
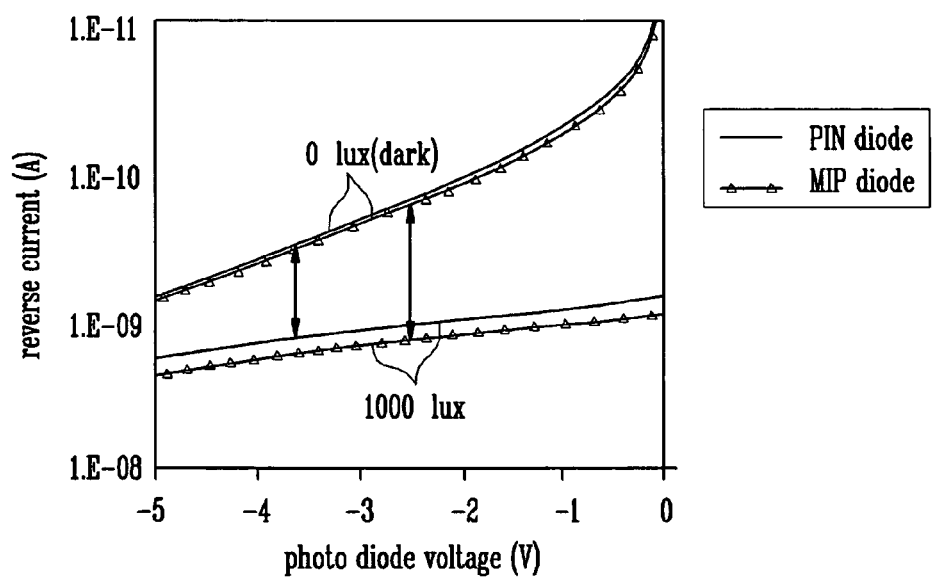
FIG. 4 illustrates a graph comparing light sensitivity of a conventional PD and a PD according to an exemplary embodiment of the present invention.

FIG. 4 illustrates a graph comparing light sensitivity of a PIN PD and an MIP PD. In FIG. 4, X axis represents voltage (V) applied to the PD, and Y axis represents a reverse current (A) of the PD that is varied according to the voltage applied to the PD. Each PD was formed to have a length L of 4 μm and a width W of 25,000 μm. Generally, an external light of a PD is measured when a voltage of −0.5 to −2.0 (V) is applied to the PD.

A voltage of −5 to 0 (V) was applied to each PD, and a reverse current of the PD was measured when the voltage on the PD was varied between −5 V to 0 V. Ambient light was measured by each PD. In order to determine sensitivity of each of the PDs to light, a sensitivity ratio was measured. The sensitivity ratio refers to a dynamic difference between ON/OFF states of the reverse current. In other words, the sensitivity ratio refers to a difference between an OFF state, i.e., a reverse current through the PD when external luminance is 0 Lux, and an ON state, i.e., a reverse current through the PD when the external luminance is greater than 0 Lux at a substantially same voltage. An external luminance of 0 Lux refers to dark surroundings with substantially no light, and external luminance that is greater than 0 Lux was used as 1000 Lux. The PD was determined as having an increased sensitivity to light if a sensitivity ratio thereof was high. For example, a higher sensitivity ratio between the ON/OFF states of the reverse current indicated a higher sensitivity to light.

As illustrated in FIG. 4, the MIP PD exhibited a higher sensitivity ratio than the NIP PD, i.e., a higher reverse current ratio between the two curves indicated by the double-headed arrows in FIG. 4. More specifically, as illustrated in FIG. 4, a sensitivity ratio of the PIN PD at a voltage varying from about (−0.5) V to about (−2.0) V was about 1-1.5 orders (v/decade), while a sensitivity ratio of the MIP PD at a same voltage range was about 1.2-1.8 orders. As such the MIP PD may have a higher sensitivity ratio, i.e., by about 0.2 to about 0.5 orders. Here, 1 order represents $10^{-1}$ (A), and 2 orders represent $10^{-2}$ (A). Also, the MIP PD exhibited better accuracy in measuring ambient light due to its increased sensitivity to the light.

A PD according to embodiments of the present invention, e.g., a MIP diode, may be advantageous in exhibiting a higher light sensitivity than a PIN diode. Therefore, ambient light may be measured by the PD with an increased accuracy. As a result, the MIP diode may have an excellent sensitivity to the light since it has a higher sensitivity ratio than the PIN diode. More specifically, the sensitivity of the PD may be enhanced by forming the PD to have a MIP structure. Therefore, the luminance of the LED may be controlled according the external light by detecting ambient light of the light emitting display device more effectively using the PD. Also, the fabrication process may be simplified by doping one side of the photo diode with P-type impurity used in the source/drain region of the semiconductor layer.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A light emitting display device, comprising:
    a light emitting diode and a thin film transistor on a substrate, the light emitting diode and thin film transistor being electrically coupled to each other; and
    a photo diode on the substrate, the photo diode including an intrinsic region and a P-type doping region coupled to each other.

2. The light emitting display device as claimed in claim 1, further comprising a first metal electrode coupled to the intrinsic region of the photo diode and a second metal electrode coupled to the P-type doping region of the photo diode, the first and second metal electrodes having a space therebetween.

3. The light emitting display device as claimed in claim 2, wherein an upper surface of the intrinsic region of the photo diode overlaps the space between the first and second metal electrodes.

4. The light emitting display device as claimed in claim 1, wherein the thin film transistor is a PMOS.

5. The light emitting display device as claimed in claim 1, wherein the photo diode is spaced apart from the thin film transistor.

6. The light emitting display device as claimed in claim 5, wherein the photo diode and the thin film transistor are co-planar along a plane parallel to a plane of the substrate.

7. The light emitting display device as claimed in claim 5, wherein the P-type doping region and the intrinsic region of the photo diode are co-planar along a plane parallel to a plane of the substrate.

8. The light emitting display device as claimed in claim 7, wherein the P-type doping region is between the thin film transistor and the intrinsic region.

9. The light emitting display device as claimed in claim 1, wherein the photo diode consists essentially of the P-type doping region and the intrinsic region.

* * * * *